United States Patent
Japp et al.

(10) Patent No.: US 6,820,332 B2
(45) Date of Patent: Nov. 23, 2004

(54) LAMINATE CIRCUIT STRUCTURE AND METHOD OF FABRICATING

(75) Inventors: Robert M. Japp, Vestal, NY (US); Voya R. Markovich, Endwell, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 10/196,993

(22) Filed: Jul. 16, 2002

(65) Prior Publication Data

US 2003/0042046 A1 Mar. 6, 2003

Related U.S. Application Data

(62) Division of application No. 09/947,130, filed on Sep. 5, 2001, now Pat. No. 6,459,047.

(51) Int. Cl.[7] .................................................. H01K 3/10
(52) U.S. Cl. .............................. 29/852; 29/846; 29/830; 427/97; 427/99; 174/256; 174/255; 174/259; 174/262; 174/265; 361/792; 428/901
(58) Field of Search ....................... 29/830, 846, 852; 427/97, 99; 174/259, 261, 262, 265, 266; 361/746, 792, 793; 428/901, 209, 629

(56) References Cited

U.S. PATENT DOCUMENTS

| 4,911,796 | A | | 3/1990 | Reed .......................... 204/15 |
|---|---|---|---|---|
| 5,055,342 | A | | 10/1991 | Markovich et al. ......... 428/137 |
| 5,137,461 | A | | 8/1992 | Bindra et al. ................. 439/74 |
| 5,208,068 | A | | 5/1993 | Davis et al. .................. 427/97 |
| 5,285,017 | A | | 2/1994 | Gardner |
| 5,386,088 | A | | 1/1995 | Gardner ...................... 174/261 |
| 5,779,836 | A | * | 7/1998 | Kerrick ....................... 156/150 |
| 5,930,668 | A | | 7/1999 | Gardner ...................... 438/624 |
| 6,175,087 | B1 | | 1/2001 | Keesler et al. .............. 174/261 |
| 6,201,194 | B1 | | 3/2001 | Lauffer et al. .............. 174/261 |
| 6,204,453 | B1 | | 3/2001 | Fallon et al. ................ 174/255 |
| 6,479,093 | B2 | * | 11/2002 | Lauffer et al. ................ 427/96 |
| 6,496,356 | B2 | * | 12/2002 | Japp et al. ............... 361/306.3 |

OTHER PUBLICATIONS

"Multi Layer Substrate with Low Coefficient of Thermal Expansion", K. Nakamura et al., Sep. 22, 2000, 2000 International Symposium on Microelectronics.

* cited by examiner

Primary Examiner—Richard Chang
(74) Attorney, Agent, or Firm—William N. Hogg

(57) ABSTRACT

A substrate and a method of making the substrate is provided. The substrate includes a layer of metal with at least one through hole therein, the layer of metal having an adhesion promoting layer thereon. A layer of a partially cured low-loss polymer or polymer precursor is positioned on the adhesion promoting layer and a plurality of conductive circuit lines are positioned on a portion of the partially cured dielectric layer. The substrate can be used as a building block in the fabrication of a multilayered printed circuit board.

20 Claims, 3 Drawing Sheets

LAMINATE CIRCUIT STRUCTURE AND METHOD OF FABRICATING

CROSS REFERENCE TO RELATED APPLICATION

This application is a divisional of application Ser. No. 09/947,130, filed Sep. 5, 2001, now U.S. Pat. No. 6,459,047.

FIELD OF THE INVENTION

The present invention relates to laminate circuit board structures for use in making multilayer printed circuit boards, and in particular to organic circuit board structures for use in such boards.

BACKGROUND OF THE INVENTION

A conventional technique of forming a laminate circuit board structure includes forming layers of dielectric material and layers of electrically conducting material to provide multiple layers of circuits, dielectrics, and voltage planes.

Conventional multilayer printed circuit boards are typically constructed from glass cloth prepreg and copper. Normally copper clad laminates are circuitized and then "laid up" in a sequential fashion with other circuitized cores and additional sticker prepreg (sticker sheets) to form composites. Once laminated, conventional composite boards are drilled and then plated to form multilayer printed circuit boards.

Composites constructed using 2 signal planes and one power (plane (2S1P) building block cores, offer a number of advantages over conventional construction techniques. One of these advantages is a 2S1P building block core that is testable prior to composite lamination. Known methods of making 2S1P cores involve drilling or etching clearance holes in bare sheets of copper, laminating these sheets with uncured conventional prepreg and foil, followed by fully curing the laminated sheets to produce a core that can be circuitized to form signal planes. Regardless of the method used to make the 2S1P cores, these are typically adhered using additional "sticker" sheets placed between the 2S1P cores. These additional "sticker" sheets contribute additional thickness and exacerbate many of the problems associated with additional thickness.

More recently, techniques have been provided that enable a relatively inexpensive photo lithographic technique of forming a composite laminate structure from individual discrete laminate structures into a composite laminate structure. Along these lines see U.S. patent applications Ser. No. 09/203,945 entitled "Two Signal One Power Plane Circuit Board", now U.S. Pat. No. 6,204,453; Ser. No. 09/203,978 entitled "Multi-Layer Organic Chip Carrier Package", now U.S. Pat. No. 6,201,194; and Ser. No. 09/204,458 entitled "Composite Laminate Circuit and Method of Forming the Same", now U.S. Pat. No. 6,175,087, entire disclosures of which are incorporated herein by reference.

Although the structures and methods of these inventions provide significant advances and advantages over current multi-layer printed circuit board fabrication methods, there still exists a need for further improvement. 2S1P cores built with glass cloth free materials, such as low loss dielectric polymers and polymer precursors allow very small laser drilled holes to be made. One very important aspect in the fabrication of 2S1P cores using low loss dielectric polymers or polymer precursors is the adhesion of these low loss polymers or polymer precursors to the ground plane or power planes which comprise 2S1P core building blocks.

Another very important aspect of using these 2S1P cores to build high density multilayer composite printed circuit boards is the method used to adhere the 2S1P cores, and any other layers which comprise the composite, within a multilayer printed circuit board without "sticker" sheets. It is desirable to have a substrate and a method of making a substrate that has good adhesion of low loss polymer or polymer precursors to the ground planes or power planes which comprise 2S1P building block cores. It is also desirable to have a substrate with low loss dielectrics or polymer precursors and a method of making the substrate without "sticker" sheets that can be used in the fabrication of a multilayer printed circuit board.

OBJECTS AND SUMMARY OF THE INVENTION

Accordingly, it is an object of this invention to enhance the art of packaging technology.

It is another object of this invention to provide a substrate for use in the manufacture of a multilayer printed circuit board, the substrate having a metal layer, an adhesion promoting layer positioned on the metal layer and a partially cured layer of dielectric material positioned on the adhesion promoting layer.

It is yet another object of the invention to provide a method of making such a substrate having a metal layer, an adhesion promoting layer positioned on the metal layer, and a partially cured layer of dielectric material positioned on the adhesion promoting layer.

Another object is to provide such a structure and method that are both adaptable to mass production, thus assuring lower costs.

According to one aspect of the invention, there is provided a substrate comprising a first metal layer having a first surface including at least one through hole therein defined by at least one side wall extending through the first metal layer, an adhesion promoting layer positioned on the first surface of the first metal layer and on the at least one side wall of the through hole, a layer of at least a partially cured dielectric material positioned on the adhesion promoting layer, and a plurality of conductive circuit lines positioned on a portion of the layer of the at least partially cured dielectric material.

According to another aspect of the invention, there is provided a method of making a substrate comprising providing a first metal layer having a first surface including at least one through hole therein defined by at least one side wall extending through the first metal layer, forming an adhesion promoting layer on the first surface of the first metal layer and on the at least one side wall of the through hole, applying a layer of a dielectric material on the adhesion promoting layer, heating the layer of dielectric material so as to at least partially cure the layer of dielectric material, and positioning a plurality of conductive circuit lines on a portion of the layer of the at least partially cured dielectric material.

According to yet another aspect of the invention, there is provided a method of making a substrate comprising providing a first metal layer having a first surface including at least one through hole therein defined by at least one side wall extending through the first metal layer, forming an adhesion promoting layer on the first surface of the first metal layer and on the at least one side wall of the through hole, applying a layer of a low-loss dielectric polymer or a polymer precursor on the adhesion promoting layer, heating the layer of low-loss dielectric polymer or polymer precursor so as to at least partially cure the layer of low-loss dielectric polymer or polymer precursor, and positioning a plurality of conductive circuit lines on a portion of the layer of the at least partially cured low loss dielectric polymer or polymer precursor.

The above objects, advantages, and features of the present invention will become more readily apparent from the following detailed description of the preferred embodiments as illustrated in the accompanying drawings.

BEST MODE FOR CARRYING OUT THE INVENTION

Figure 1:
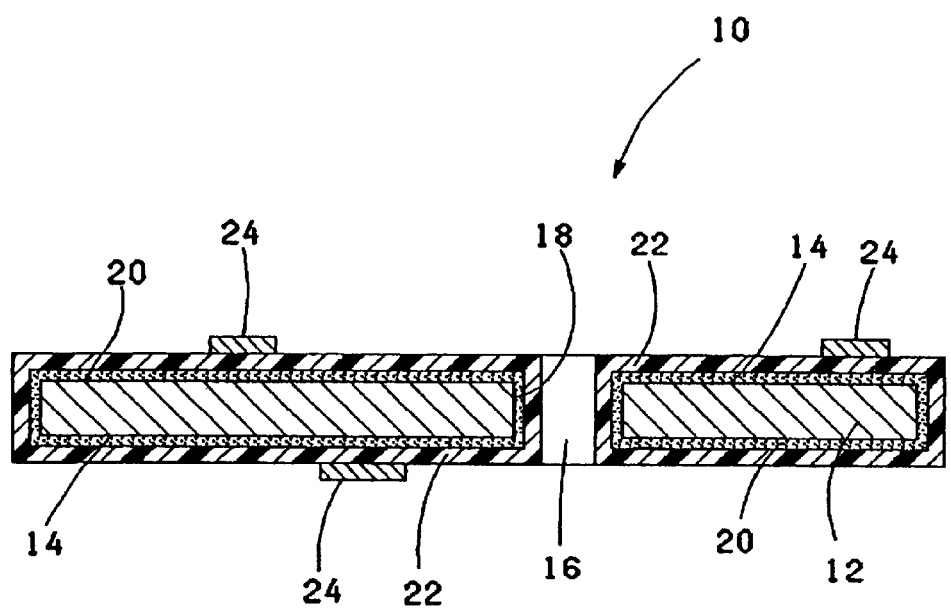
FIG. 1 is a much enlarged partial sectional view, in elevation, of the substrate of the present invention illustrating a metal layer having a through hole therein, an adhesion promoting layer positioned on the metal layer, a layer of dielectric material positioned on the adhesion promoting layer, and a plurality of conductive circuit lines positioned on a portion of the layer of dielectric material.

A substrate 10 illustrating one embodiment of the present invention is shown in FIG. 1. The substrate includes a first metal layer 12 with a first surface 14. First metal layer 12 has a through hole 16 therein defined by at least one side wall 18 extending through the first metal layer. An adhesion promoting layer 20 is positioned on first surface 14 of first metal layer 12 and on side wall 18 of through hole 16. A layer of a partially cured dielectric material 22 is positioned on adhesion promoting layer 20 and a plurality of conductive circuit lines 24 is positioned on a portion of the layer of partially cured dielectric material over first surface 14 of first metal layer 12.

The first metal layer 12 is selected from the group consisting of nickel, copper, molybdenum, iron, or alloys thereof. The metal layer can function as a thermally conductive layer, an electrical reference plane, or as a power or ground current carrying distribution plane. The preferred metal layer is a three layered structure comprised of a first layer of copper, a second layer of an alloy of about 34% by weight to about 38% by weight nickel and about 62% by weight to about 66% by weight iron, and a third layer of copper. Preferably, about 72% to about 78% of the thickness of the metal layer is the nickel-iron alloy and about 22% to about 28% of the thickness of the metal layer is copper. A suitable 36% nickel-64% iron alloy is available under the tradename Invar from Texas Instruments Incorporated (Attleboro, Mass.). Alternatively, the metal layer can be formed solely of a single metal or a single metal alloy such as about 36% by weight nickel and about 64% by weight iron. The thickness of the metal layer is preferably from about 0.0005 inches (0.5 mils) to about 0.004 inches.

Adhesion promoting layer 20 can be comprised of a coupling agent, a second metal layer, or a metal oxide. Suitable coupling agents that can be used in this invention are silanes. Suitable silane coupling agents include, but are not limited to, Dow-Corning Z-6040, 3-glycidoxypropyltrimethoxysilane, Dow-Corning Z-6032, N-2(vinylbenzylamino)-ethyl-3-aminopropyltrimethoxysilane, cationic styrylamine trimethoxysilane, Dow-Corning Z-6020, aminoethylaminopropyltrimethoxysilane, Dow-Corning Z-6030,3-methacryloxypropyltrimethoxysilane, and Dow-Corning Z-6011, 3-aminopropyltriethoxysilane. These coupling agents can be suitably applied according to the manufacturer's instructions. These silane coupling agents are available from Dow Corning Corporation (Dow Corning Corporate Center, P.O. Box 994, Midland, Mich. 48686-0994). Other suitable commercially available adhesion promotion treatments include conventional copper oxide deposition processes such as the Shipley reduced oxide process, "Pro bond-80, available from Shipley Company L.L.C., (455 Forest Street, Marlborough, Mass. 01752), or the copper surface roughness enhancement process known as "Bondfilm", available from Atotech USA Inc., (500 Science Park Road, State College, Pa., 16801.

A suitable metal which can be used as an adhesion promoting layer is chromium. The chromium layer can preferably be deposited by sputtering and is composed of about 99.99% pure chromium metal. The optimum thickness for the chromium layer is about 800 to 1500 angstroms.

Figure 2:
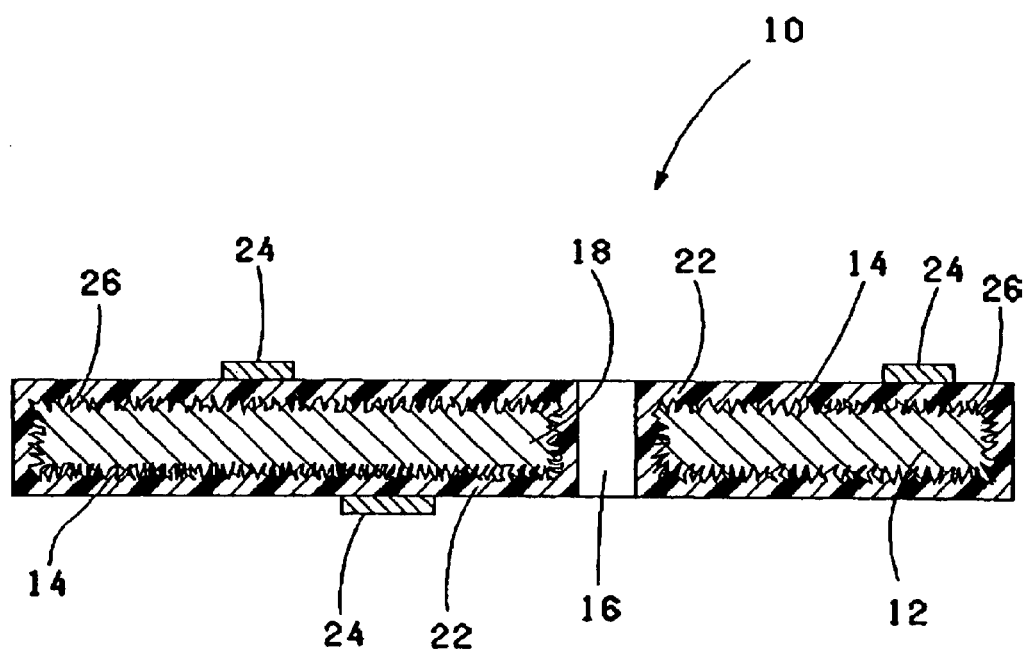
FIG. 2 is a much enlarged partial sectional view, in elevation, of a substrate according to another embodiment of the invention, illustrating the adhesion promoting layer as a layer of dendrites on the surface of the metal layer.

Referring to FIG. 2, the adhesion promoting layer can comprise a plurality of dendrites 26 in first surface 14 of metal layer 12, the composition of which can be the same as that of the metal layer. The formation and use of such dendrites is described in U.S. Pat. No. 5,137,461, which is incorporated by reference herein. Selection of the specific optimum adhesion promoting layer depends on the particular combination of both first metal layer 12 and material of dielectric layer 22 used. Obtaining high adhesion between first metal layer 12 and dielectric layer 22 is very important because the low in plane coefficient of thermal expansion (CTE)of the first metal layer is used to constrain the CTE of the entire mulitlayered printed circuit board. Therefore differential CTEs of first metal layer 12 and dielectric layer 22 can create high shear stress at the interface of the two materials during thermal cycling such as during bake, assembly, or field operation. A strong bond between these materials is important in order to withstand this shear stress.

The partially cured dielectric layer 22 comprises a partially cured low-loss dielectrics polymer or polymer precursor. A low-loss factor dielectric polymer, (or laminate), is defined as any thermoset material having a dielectric loss tangent of less then or equal to about 0.01. Suitable polymers include, but are not limited to, bismaleimide/triazine/epoxy blends, available from Mitsubishi(Tokyo, Japan), cyanate esters, available from Vantico Inc. (Brewster, N.Y.), and allyated polyphenylene oxide, available from Asahi Chemical Co.(Fugi City, Japan).

Importantly, use of a partially cured low-loss dielectric polymer or polymer precursor in a substrate enables use of the substrate in the fabrication of a multilayer printed circuit board without the need for sticker sheets during the lay-up and lamination steps of fabrication. Typically, when building 2S1P cores which are laminated together to make a composite, additional layers of dielectric are needed which will act as the adhesive sheets to bond the 2S1P cores together. The current invention avoids the need for these additional layers by using "b-staged" dielectric in the substrate as the composite adhesive. A partially cured dielectric polymer or polymer precursor can be described as a dielectric polymer having its cure state advanced to an intermediate degree. This is sometimes called "b-staging". The amount of cure can be characterized by physical properties including viscosity, molecular weight, cross-link density, shear modulus, and glass transition temperature. As the amount of cure increases, all of these properties also increase. When a thermoset dielectric polymer or polymer precursor is cured, molecules react or combine with other molecules to ultimately form chains or networks of larger molecules. When the polymer is fully reacted so that a continuous network of molecules is formed, it is considered to be substantially fully cured. However, when the low-loss dielectric polymer or polymer precursor is only partially cross-linked, the system is only partially cured or "b-staged". This "b-staging" process can be accomplished by application of heat energy or by exposure to actinic radiation, if the thermoset dielectric polymer or polymer precursor is photosensitive. Upon subsequent heating the polymer will again become tacky, adhering to whatever material it is in contact with, for example, adjacent cores. With continued heating the polymer will be rendered substantially fully cured. A composite may be made using this "b-stage" adhesion process to bond adjacent substrates or cores that make-up the composite.

The partially cured dielectric material may include a filler. The filler comprises a material selected from the group consisting of silica, sol-gel particles, and E-glass particles. Silica, having the chemical formula $SiO_2$, can be selected from the group consisting of crystalline silica, fumed silica, synthetic silica, precipitated silica and amorphous silica. Crystalline silica and amorphous silica are obtained/mined (ground and purified) from natural sources. Purification removes other elements and ionic impurities. The purification step involves both thermal and chemical processes. Synthetic silica and precipitated silica can be obtained from sol (colloidal)/gel chemical processing of silanes, which involves the polymerization of silanes into small insoluble silica particles. Such a reaction permits the preparation of highly pure silica (without natural mineral impurities) having controlled size and shape. Fumed silica is a synthetic silica prepared from the reaction of $SiCl_4$, hydrogen, and oxygen in the gas phase to form $SiO_2$. The silica particles can have substantially spherical or spheroidal shapes and have sizes of from about 0.1 microns to about 40 microns. The addition of silica particles of this shape and size facilitates the layer of dielectric material such that it will readily flow into the at least one through hole and conform to its side wall. Another function of the filler is to reduce the CTE of the dielectric material in all three dimensions thus reducing both the in plane stress and the stress on the plated through holes in the Z direction.

Another useful filler is spherical E-glass filler such as either 3000E or 6000E, sold by potters Industries Inc. (Valley Forge, Pa.). This type of filler is comprised of electrical grade glass and includes particle diameter distributions ranging from about 18 microns to about 65 microns for Potters 3000E and from about 3 microns to about 15 microns for Potters 6000E. E-Glass has a composition of from about 52 to about 56 wt % silicon dioxide, of from about 16 to about 25 wt % calcium oxide, of from about 12 to about 16 wt % aluminum oxide, of from about 5 to about 10 wt % boron oxide, of from about 0 to about 2 wt % sodium oxide and potassium oxides, of from about 0 to about 5 wt % magnesium oxide, of from about 0 to about 0.4 wt % iron oxide, from about 0 to about 0.8 wt % titanium oxide, and from about 0 to about 1 wt % fluorides.

Figure 3:
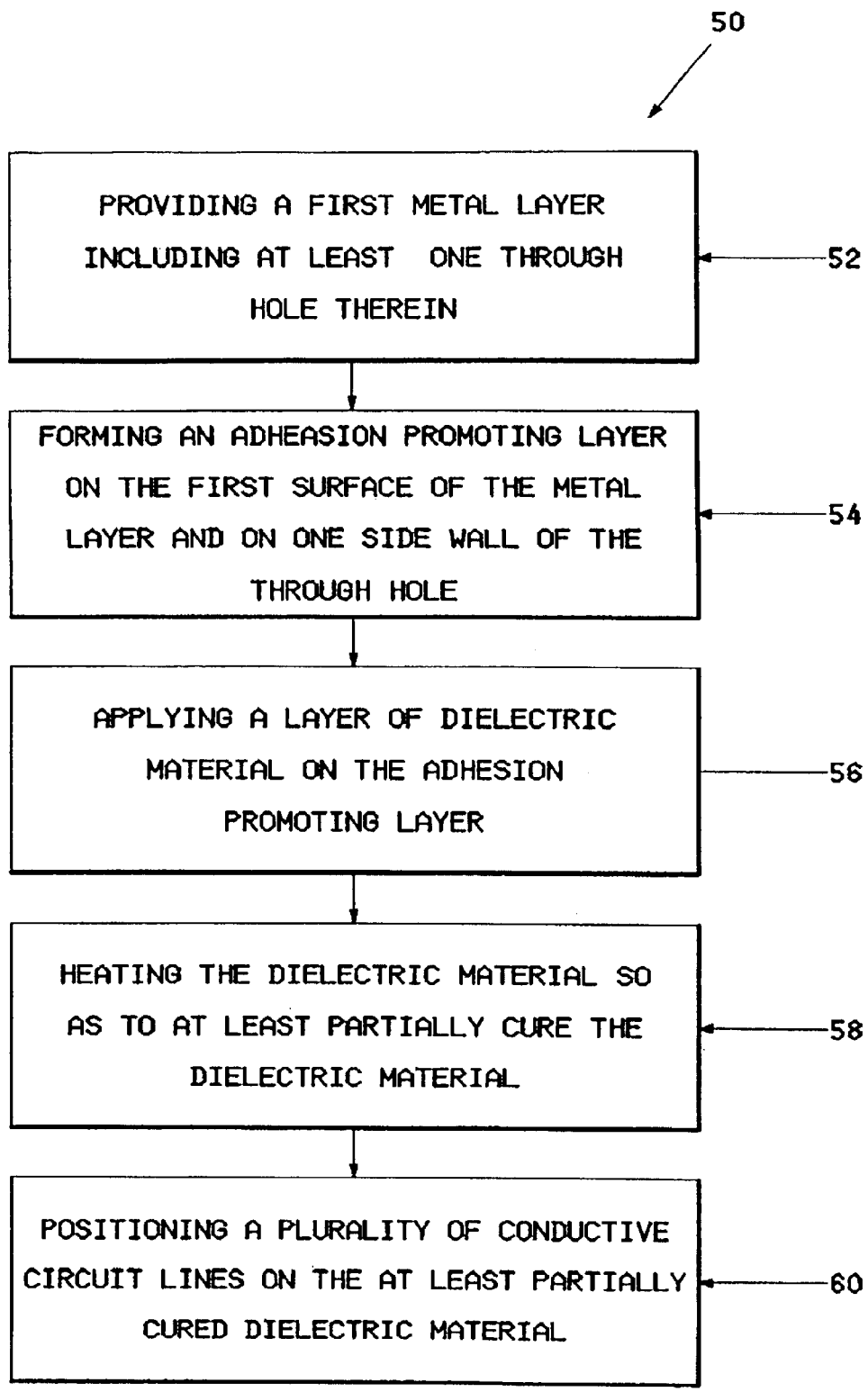
FIG. 3 is a process flow diagram showing the method for making the substrate according to the present invention.

Referring to FIG. 3, a method 50 of making a substrate is shown. The first step 52 in this method is providing a first metal layer having a first surface including at least one through hole therein defined by at least one side wall extending through the first metal layer. The metal layer has been previously described in detail above. The through holes in the metal layer can be formed by mechanical drilling, laser drilling, punching, or etching. A technique for etching includes the use of a photo lithographic process where the location of each of the through holes is patterned and developed in a layer of photo resist coated onto both sides of the metal layer. The through holes are then etched through the metal layer in the location of the pattern with a suitable etchant. The photo resist is then stripped.

The metal layer may be provided by a roll to roll process. A roll to roll process produces unit part images which are attached to each other in a continuous coil or roll of material. Although the roll is a continuous length, unit hole patterns can be formed by indexing the roll through a hole-making process as previously described. The advantages of roll to roll processing are simplified handling, high through-put, and reduced cost.

Step 54 includes forming an adhesion promoting layer on the first surface of the first metal layer and on the at least one side wall of the through hole. Significantly, this step greatly improves the adhesion of the subsequently applied layer of low loss dielectric polymer or polymer precursor to the metal layer which will not substantially adhere to the metal layer without adhesion promotion of the type described herein. The adhesion promoting layer can be a coupling agent, a second metal layer, or a metal oxide as described above. The step of forming the adhesion promoting layer can also comprise the step of roughening the first surface of the first metal layer.

Roughening can be performed by many processes including any of the following processes. If the outside surface of the metal plane is copper, a copper oxide, such as Shipley Pro bond-80(™) or a copper roughening process known as Atotech Bondfilm(™) process can be used. Additionally roughening can also be achieved with conventional chemical microetching or abrasive media blasting. The roughening step can further include forming a layer of dendrites in the first surface of the first metal layer. Chrome metal may also be applied by sputtering. If the metal plane is either pure Invar or molybdenum, the adhesion promotion process can be abrasive media blasting and/or chrome sputtering. Any of the above roughening or adhesion promotion processes can be performed using a roll to roll process.

EXAMPLE

A 13 inch wide roll of 12.5%/75%/12.5% by weight copper/Invar/copper was coated on both sides with 12 mil. thick Dupont MI (1.5 mil. thick photo resist). The resist is exposed to 60 Millijoules of UV light on each side (one side is pattern imaged and the other side is blanket exposed) using a conventional PCB exposure machine. The roll is indexed through the exposure machine with one unit circuit board image exposed at a time. The completely exposed roll is then set up on a roll to roll Mylar peel/develop/etch/strip line and conventional chemical developing, etching and stripping is performed. Next the roll is moved to a roll to roll horizontal process tool capable of applying the Atotech Bondfilm(™) treatment process for further processing. The step of forming the adhesion promoting layer includes the step of applying a coupling agent, a second metal layer, or a metal oxide, as described above, on the first surface of the first metal layer and on the at least one side wall of the through hole.

Step 56 includes applying a layer of the above-defined low loss dielectric polymer or polymer precursor material on the adhesion promoting layer. This dielectric layer can be applied by a variety of processes, including but not limited to, dry film hot roll lamination, roll to roll die slot coating, roll to roll reverse roll coating, dip coating and conventional flat press lamination. The optimum method of application depends on the base composition of the low loss dielectric polymer and the physical form in which it is supplied, dry film, solvent carried liquid, solvent free coated copper foil or self supported film. The preferred method is conventional flat press lamination using solvent free resin coated copper foils.

Step 58 includes heating the layer of low loss dielectric polymer or polymer precursor material so as to at least partially cure the dielectric material. Partial curing can also be accomplished by application of pressure followed by heating so as to at least partially cure the layer. The heating step can be performed at a temperature of from about 90° C. to about 130° C. for about 10 minutes to about 30 minutes.

Referring to step 60, a plurality of conductive circuit lines can be positioned on a portion of the layer of at least partially cured low-loss dielectric polymeric or polymer precursor material. The conductive circuit lines can be comprised of a material such as etched electrodeposited copper foil, plated copper metal, aluminum, silver or gold, and can be applied by any well known technique such as print and etch, electrolytic plating, electroless plating, or sputtering.

In addition to 2S1P cores, the invention described hereinabove, can be also used to fabricate zero signal plane one power plane cores (0S1P) and 0S3P cores using similar process flows. These structures can also be adhered into composite structures with the above-defined process of the 2S1P cores.

This invention improves overall cost, performance, and reliability of a resultant multilayer circuit board made with the invention. Cost is reduced by improved handling of very thin and fragile materials resulting in improved yields. Reduced composite thickness (due to use of the b-staged core dielectric to adhere the composite layers) improves cost, performance and reliability. Improved adhesion of the cores improves field performance due to improved resistance to electrical opens during operational thermal cycling.

While there have been shown and described what are the present considered preferred embodiments of the invention, it will be obvious to those skilled in the art that various changes and modifications may be made therein without departing from the scope of the invention as defined by the appended claims.

We claim:

1. A method of making a substrate comprising:
   providing a first metal layer having a first surface including at least one through hole therein defined by at least one side wall extending through said first metal layer;
   forming an adhesion promoting layer on said first surface of said first metal layer and on said at least one side wall of said through hole;
   applying a layer of a dielectric material on said adhesion promoting layer;
   heating said layer of dielectric material so as to partially cure said layer of dielectric material; and
   positioning a plurality of conductive circuit lines on a portion of said layer of said partially cured dielectric material.

2. The method of making the substrate of claim 1, wherein said step of providing said first metal layer is performed by a roll to roll process.

3. The method of making the substrate of claim 1, wherein said step of forming said adhesion promoting layer comprises the step of roughening said first surface of said first metal layer.

4. The method of making the substrate of claim 3, wherein said roughening step further includes forming dendrites on said first surface of said first metal layer.

5. The method of claim 4 further characterized by laminating two of said substrates together without the use of a sticker sheet.

6. The method of making the substrate of claim 1, wherein said step of forming said adhesion promoting layer comprises the step of applying a coupling agent or a second metal layer on said first surface of said first metal layer and on said at least one side wall of said through hole.

7. The method of claim 6 further characterized by laminating two of said substrates together without the use of a sticker sheet.

8. The method of making the substrate of claim 1, wherein said heating step is performed at a temperature of from about 90° C. to about 130° C. for about 10 minutes to about 30 minutes.

9. The method of claim 8 further characterized by laminating two of said substrates together without the use of a sticker sheet.

10. The method of claim 1 further characterized by laminating two of said substrates together without the use of a sticker sheet.

11. A method of making a substrate comprising:
    providing a first metal layer having a first surface including at least one through hole therein defined by at least one side wall extending through said first metal layer;
    forming an adhesion promoting layer on said first surface of said first metal layer end on said at least one side wall of said through hole;
    applying a layer of a low-loss dielectric polymer o a polymer precursor on said adhesion promoting layer;
    heating said layer of low-loss dielectric polymer or polymer precursor so as to -partially cure said layer of low-loss dielectric polymer or polymer precursor; and
    positioning a plurality of conductive circuit lines on a portion of said layer of said partially cured low-loss dielectric polymer or polymer precursor.

12. The method of making the substrate claim 11, wherein said step of providing said first metal layer is performed by a roll to roll process.

13. The method of making the substrate of claim 11, wherein said step of forming said adhesion promoting layer comprises the step of roughening said first surface of said first metal layer.

14. The method of making the substrate of claim 13, wherein said roughening step further includes forming dendrites on said first surface of said first metal layer.

15. The method of claim 14 further characterized by laminating two of said substrates together without the use of a sticker sheet.

16. The method of making the substrate of claim 11, wherein said step of forming said adhesion promoting layer comprises the step of applying a coupling agent or a second metal layer on said first surface of said first metal layer and on said at least one side wall of said through hole.

17. The method of claim 16 further characterized by laminating two of said substrates together without the use of a sticker sheet.

18. The method of making the substrate of claim 11, wherein said healing step is performed at a temperature of from about 90° C. to about 130° C. for about 10 minutes to about 30 minutes.

19. The method of claim 18 further characterized by laminating two of said substrates together without the use of a sticker sheet.

20. The method of claim 11 further characterized by laminating two of said substrates together without the use of a sticker sheet.

* * * * *